(12) United States Patent
Kim et al.

(10) Patent No.: US 7,985,607 B2
(45) Date of Patent: Jul. 26, 2011

(54) METHOD OF PREPARING QUANTUM DOT-INORGANIC MATRIX COMPOSITES

(75) Inventors: Sungjee Kim, Pohang-si (KR); JinSik Lee, Busan (KR); SongJoo Oh, Busan (KR)

(73) Assignees: Samsung Electronics Co., Ltd. (KR); Pohang University of Science and Technology Academy-Industry Foundation (KR)

( * ) Notice: Subject to any disclaimer, the term of this patent is extended or adjusted under 35 U.S.C. 154(b) by 179 days.

(21) Appl. No.: 12/318,874

(22) Filed: Jan. 12, 2009

(65) Prior Publication Data
US 2009/0267051 A1 Oct. 29, 2009

(30) Foreign Application Priority Data
Apr. 23, 2008 (KR) ........................ 10-2008-0037883

(51) Int. Cl.
*H01L 21/00* (2006.01)
*B05D 7/00* (2006.01)
(52) U.S. Cl. ......................................... 438/29; 427/215
(58) Field of Classification Search .................... 257/14, 257/79, 17, E29.071, 22, E33.008; 427/240, 427/157, 126.4, 215, 126.3; 438/29, 962, 438/681
See application file for complete search history.

(56) References Cited

U.S. PATENT DOCUMENTS
| | | | |
|---|---|---|---|
| 2005/0051766 A1* | 3/2005 | Stokes et al. | 257/17 |
| 2005/0051769 A1* | 3/2005 | Jang et al. | 257/40 |
| 2006/0289853 A1* | 12/2006 | Chen et al. | 257/14 |
| 2007/0199109 A1* | 8/2007 | Yi et al. | 977/811 |

OTHER PUBLICATIONS

Murray et al., "Synthesis and Characterization of Nearly Monodisperse CdE (E=S, Se, Te) Semiconductor Nanocrystallites", 1993, J. AM. Chem. Soc., vol. 115, pp. 8706-8715.*

* cited by examiner

*Primary Examiner* — Thomas L Dickey
*Assistant Examiner* — Nikolay Yushin
(74) *Attorney, Agent, or Firm* — Cantor Colburn LLP

(57) ABSTRACT

A method for preparing a quantum dot-inorganic matrix composite includes preparing an inorganic matrix precursor solution containing one or more quantum dot precursors, spin-coating the precursor solution on a substrate to form an inorganic matrix thin film, and heating the inorganic matrix thin film to form an inorganic matrix, while growing the quantum dot precursors into quantum dots in the inorganic matrix, thereby yielding a quantum dot-inorganic matrix composite. The quantum dot-inorganic matrix composite thus obtained has a structure in which the quantum dots have a high efficiency and are densely filled in an inorganic matrix. The quantum dot-inorganic matrix composites can be prepared using a low temperature process, and can be used for various displays and electronic device material applications.

7 Claims, 4 Drawing Sheets
(2 of 4 Drawing Sheet(s) Filed in Color)

METHOD OF PREPARING QUANTUM DOT-INORGANIC MATRIX COMPOSITES

This application claims priority to Korean Patent Application No. 10-2008-37883, filed on Apr. 23, 2008, and all the benefits accruing therefrom under 35 U.S.C. §119, the contents of which in its entirety are herein incorporated by reference.

BACKGROUND OF THE INVENTION (1) Field of the Invention

This disclosure is directed to a method of preparing quantum dot-inorganic matrix composites. More specifically, this disclosure is directed to a method of preparing quantum dot-inorganic matrix composites, comprising preparing an inorganic matrix precursor solution, spin coating the precursor solution on a substrate and heating the coated substrate to obtain quantum dot-inorganic matrix composites.

(2) Description of the Related Art

A quantum dot is defined as a crystalline material having a size of a few nanometers, and consists of several hundred to several thousand atoms. Since such a small-sized quantum dot has a large surface area per unit volume, most of the constituent atoms of the quantum dot are present on the surface of the quantum dot. Based on this characteristic structure, a quantum dot exhibits quantum confinement effects and shows electrical, magnetic, optical, chemical and mechanical properties different from those inherent to the constituent atoms of the quantum dot. Controlling the physical size of the quantum dot enables control of the properties of the quantum dot.

Alignment of quantum dots on a substrate enables fabrication of high integrated devices, which may be utilized in applications including optical devices such as optical amplifiers, lasers, light emitting diodes ("LEDs"), modulators, switches or the like, and memory devices. Furthermore, considerable research has been conducted on technology incorporating quantum dots with high fluorescence efficiency at a high packing density into a transparent inorganic matrix, since quantum dots have wide applicability to materials for a variety of optical devices.

BRIEF SUMMARY OF THE INVENTION

An exemplary embodiment provides a method of preparing a quantum dot-inorganic matrix composite at a relatively low temperature using quantum dot precursors that can be homogeneously dispersed in an inorganic matrix precursor solution.

Another exemplary embodiment provides a quantum dot-inorganic matrix composite in which quantum dots with high luminescence efficiency are packed at a high packing density into an inorganic matrix. Another exemplary embodiment provides an electronic device using the quantum dot-inorganic matrix composite.

Another exemplary embodiment provides a method of preparing a quantum dot-inorganic matrix composite, comprising: preparing an inorganic matrix precursor solution containing one or more quantum dot precursors; spin-coating the precursor solution on a substrate to form an inorganic matrix thin film; and heating the inorganic matrix thin film to form an inorganic matrix, while growing the quantum dot precursors into quantum dots in the inorganic matrix, thereby yielding a quantum dot-inorganic matrix composite.

Another exemplary embodiment provides a quantum dot-inorganic matrix composite in which quantum dots are dispersed in an inorganic matrix, prepared by the method according to the exemplary embodiments. Another exemplary embodiment provides an electronic device using the quantum dot-inorganic matrix composite made by the processes of the invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Example embodiments will be more clearly understood from the following detailed description taken in conjunction with the accompanying drawings. FIGS. 1-6 represent non-limiting, example embodiments as described herein.

FIG. 1 is a flow chart illustrating an exemplary embodiment of a method of preparing a quantum dot-inorganic matrix composite;

FIG. 2 is a cross-sectional view schematically illustrating an exemplary embodiment of the quantum dot-inorganic matrix composite;

FIG. 4 is fluorescence spectra of quantum dot-inorganic matrix composites prepared in Examples 1 and 3 to 5;

FIG. 5 is fluorescence images of quantum dot-glass composites prepared in Examples 1 and 3 to 5; and FIG. 6 is fluorescence images of quantum dot-inorganic matrix composites prepared in Examples 6 to 10.

DETAILED DESCRIPTION OF THE INVENTION

Figure 1:
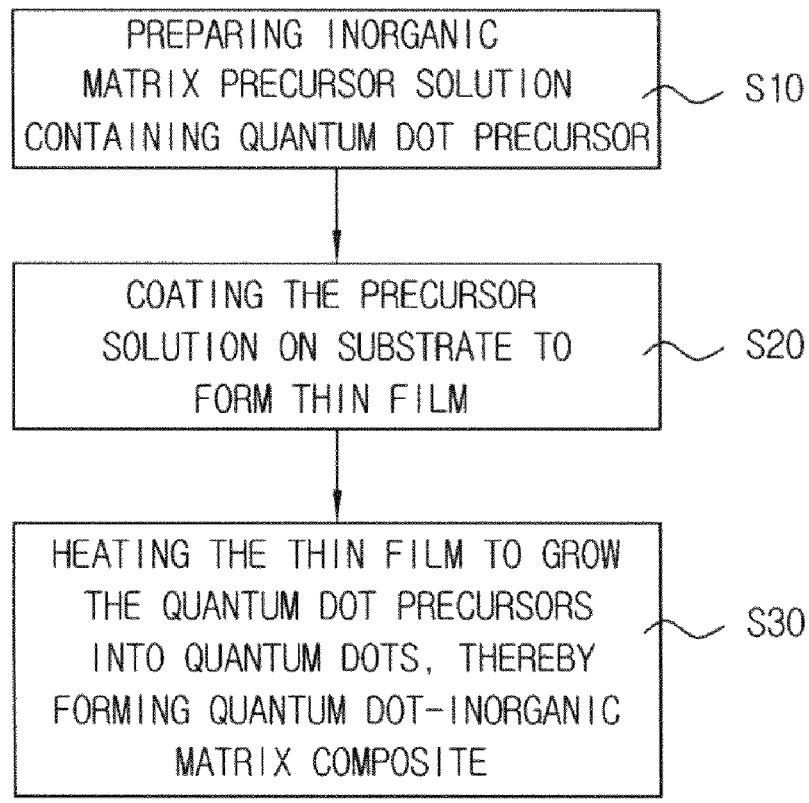

A detailed description will be given of exemplary embodiments with reference to the accompanying drawings.

It will be understood that when an element or layer is referred to as being "on," "interposed," "disposed," or "between" another element or layer, it can be directly on, interposed, disposed, or between the other element or layer or intervening elements or layers may be present.

It will be understood that, although the terms first, second, third, and the like may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, first element, component, region, layer or section discussed below could be termed second element, component, region, layer or section without departing from the teachings of the present invention.

As used herein, the singular forms "a," "an" and "the" are intended to comprise the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In the drawings, the thickness of layers and regions are exaggerated for clarity.

According to one exemplary embodiment, there is provided a method of preparing a quantum dot-inorganic matrix composite wherein quantum dots are densely filled in an inorganic matrix. FIG. 1 is a flow chart illustrating one exemplary embodiment of a method of preparing a quantum dot-inorganic matrix composite. As shown in FIG. 1, in step S10, an inorganic matrix precursor solution containing one or more quantum dot precursors is prepared. Subsequently, in step S20, the inorganic matrix precursor solution containing one or more quantum dot precursors, obtained in the preceding step, is spin-coated on a substrate, to form an inorganic matrix thin film. Then, in step S30, the inorganic matrix thin film is cured by thermal treatment to form an inorganic matrix, while growing the quantum dot precursors into quantum dots in the inorganic matrix, thereby yielding a quantum dot-inorganic matrix composite. According to one exemplary embodiment, there is provided a method of preparation of a quantum dot-inorganic matrix composites with a high packing density wherein the quantum dots have a high quantum efficiency of 40% or higher and a high packing ratio of several percent or more. According to another exemplary embodiment, emission wavelengths of the composites can be adjusted by controlling reaction conditions. A more-detailed description of respective steps will be provided.

Preparation of Quantum Dot-Containing Inorganic Matrix Precursor Solution

One or more quantum dot precursors are mixed with an inorganic matrix precursor solution to prepare a quantum dot-containing inorganic matrix precursor solution. Specifically, respective quantum dot precursors are dissolved in solvents that can be coordinated thereto to prepare quantum dot precursor solutions. The quantum dot precursor solutions are then mixed with an inorganic matrix precursor solution to obtain an inorganic matrix precursor solution.

A non limiting example of an inorganic matrix precursor solution is a spin-on-glass ("SOG") solution. The term "spin-on-glass solution" refers to a solution in which silica polymers are dispersed together with additives in polar solvents. The inorganic matrix precursor solution may be a SOG solution in which a material for SOG selected from but not limited to silicate, siloxane, silsesquioxane, perhydrosilazane and silazane; which is dissolved in an organic solvent. Examples of useful SOG materials include, but are not limited to, materials prepared from a variety of silane reactants including but not limited to triethoxysilane ("HTEOS"), tetraethoxysilane ("TEOS"), methyltriethoxysilane ("MTEOS"), dimethyldiethoxysilane, tetramethoxysilane ("TMOS"), methyltrimethoxysilane ("MTMOS"), trimethoxysilane, dimethyldimethoxysilane, phenyltriethoxysilane ("PTEOS"), phenyltrimethoxysilane ("PTMOS"), diphenyldiethoxysilane and diphenyldimethoxysilane. Examples of silane reactants that can be used to synthesize SOG materials include but are not limited to halosilanes, in particular, chlorosilanes, e.g., trichlorosilane, methyltrichlorosilane, ethyltrichlorosilane, phenyltrichlorosilane, tetrachlorosilane, dichlorosilane, methyldichlorosilane, dimethyldichlorosilane, chlorotriethoxysilane, chlorotrimethoxysilane, chloromethyltriethoxysilane, chloroethyltriethoxysilane, chlorophenyltriethoxysilane, chloromethyltrimethoxysilane, chloroethyltrimethoxysilane, and chlorophenyltrimethoxysilane. Other useful SOG materials include SOG solutions in which a SOG material such as polysiloxane or polysilazane is dissolved in an organic solvent.

These SOG materials may be mixed with an alcoholic solvent such as, but not limited to, methanol, ethanol, propanol, butanol, pentanol, hexanol, methyl cellosolve, butyl cellosolve, propylene glycol, diethylene glycol or carbinol.

The inorganic matrix precursor solution is mixed with one or more types of cuantum dot precursors, in particular, with two or more types of quantum dot precursors. The quantum dot precursor is a compound containing an element selected from Group XII element, Group XIII element, Group XIV element, Group XV element and Group XVI element; and combinations thereof Examples of Group XII element-containing quantum dot precursors include, but are not limited to dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, dimethyl cadmium, diethyl cadmium, cadmium acetate, cadmium acetylacetonate, cadmium iodide, cadmium bromide, cadmium chloride, cadmium fluoride, cadmium carbonate, cadmium nitrate, cadmium oxide, cadmium perchlorate, cadmium phosphide, cadmium sulfate, mercury acetate, mercury iodide, mercury bromide, mercury chloride, mercury fluoride, mercury cyanide, mercury nitrate, mercury oxide, mercury perchlorate, mercury sulfate, lead acetate, lead bromide, lead chloride, lead fluoride, lead oxide, lead perchlorate, lead nitrate, lead sulfate and lead carbonate.

Examples of Group XIII element-containing quantum dot precursors, include but are not limited to gallium acetylacetonate, gallium chloride, gallium fluoride, gallium oxide, gallium nitrate, gallium sulfate, indium chloride, indium oxide, indium nitrate, indium sulfate, thallium acetate, thallium acetylacetonate, thallium chloride, thallium oxide, thallium ethoxide, thallium nitrate, thallium sulfate, and thallium carbonate; and combinations thereof.

Examples of Group XIV element-containing quantum dot precursors, include but are not limited to tin acetate, tin bisacetylacetonate, tin bromide, tin chloride, tin fluoride, tin oxide, tin sulfate, germanium tetrachloride, germanium oxide, germanium ethoxide and combinations thereof.

Examples of Group XV element-containing quantum dot precursors include, but are not limited to trimethylsilyl phosphine, alkyl phosphine (for example, triethylphosphine, tributylphosphine, trioctylphosphine, triphenylphosphine and tricyclohexylphosphine), arsenic oxide, arsenic chloride, arsenic sulfate, arsenic bromide, arsenic iodide, arsenic nitrous oxide, arsenic nitric acid and arsenic ammonium nitrate.

Examples of Group XVI element-containing quantum dot precursors include, but are not limited to, alkyl thiol compounds, such as hexane thiol, octane thiol, decane thiol, dodecane thiol, hexadecane thiol and mercaptopropyl silane, sulfur-trioctylphosphine ("S-TOP"), sulfur-tributylphosphine ("S-TBP"), sulfur-triphenylphosphine ("S-TPP"), sulfur-trioctylamine ("S-TOA"), trimethylsilyl sulfur, ammonium sulfide, sodium sulfide, selenium-trioctylphosphine ("Se-TOP"), selenium-tributylphosphine ("Se-TBP"), selenium-triphenylphosphine ("Se-TPP"), tellurium-trioctylphosphine ("Te-TOP"), tellurium-tributylphosphine ("Te-TBP"), tellurium-triphenylphosphine ("Te-TPP"); and combinations thereof.

Each of the quantum dot precursors to be mixed with the inorganic matrix precursor solution may be provided in the form of a precursor solution obtained by dissolving the precursor in a solvent that can be coordinated to the precursor. For example the suitable solvents may be, but are not limited to: $C_{6-22}$ primary alkyl amines, $C_{6-22}$ secondary alkyl amines and $C_{6-22}$ tertiary alkyl amines; $C_{6-22}$ primary alcohols, $C_{6-22}$ secondary alcohols and $C_{6-22}$ tertiary alcohols; $C_{6-22}$ ketones and $C_{6-22}$ esters; $C_{6-22}$ heterocyclic compounds containing nitrogen or sulfur; $C_{6-22}$ alkanes, $C_{6-22}$ alkenes and $C_{6-22}$ alkynes; trioctylamine, trioctylphosphine and trioctylphosphine oxide; and combinations thereof.

Preparation of Inorganic Matrix Thin Film

After the preparation of the quantum dot precursor-containing inorganic matrix precursor solution, the solution is spin-coated on a substrate to form an inorganic matrix thin film. Methods of spin-coating the inorganic matrix precursor solution on the substrate are not particularly limited. For example, the spin-coating may be carried out by coating the quantum dot precursor-containing inorganic matrix precursor solution onto a substrate provided on a stage, and spinning the stage such that the substrate is homogeneously coated with the inorganic matrix precursor solution. The inorganic matrix precursor solution exists in a liquid phase prior to molding and is thus advantageously very easy to coat. In the spin-coating step, spin-coating at about 300 rpm to about 4,000 rpm enables control over the thickness of thin film to be formed. The thickness of the inorganic matrix thin film may be varied depending on end applications of final quantum dot-inorganic matrix composites. The inorganic matrix thin film may be typically formed to a thickness of about 500 nm to about 1,000 nm.

Thermal Treatment

After coating of the inorganic matrix thin film on the substrate is completed, the substrate is subjected to thermal treatment to evaporate the solvent and cure the inorganic matrix thin film. The inorganic matrix thin film is cured to form an inorganic matrix, and at the same time, reduction of the quantum dot precursors into quantum dots occurs in the inorganic matrix, to obtain a quantum dot-inorganic matrix composite in which the quantum dots are homogeneously dispersed in the inorganic matrix. The quantum dot precursor is heated at a crystallization temperature or higher to form crystalline nuclei, which are grown into quantum dots. As such, the method of preparing a quantum dot-inorganic matrix composite thin film using inorganic matrix precursors can be carried out by simple spin-coating and curing processes, thus advantageously enabling cost savings.

The quantum dot-inorganic matrix composite obtained in this step has a structure in which quantum dots are homogeneously dispersed in an inorganic matrix including a metal oxide such as, but not limited to, $SiO_2$, $TiO_2$, $ZrO_2$, ZnO, ITO or SnO.

The heating temperature depends on quantum dot materials and precursors and is typically about 150° C. to about 300° C. When the heating temperature is less than about 150° C., no or few quantum dots are formed, and when the heating temperature exceeds about 300° C., quantum dots may be excessively formed resulting in the composite having no quantum effects.

The reduction of the quantum dot precursors enables formation of quantum dot particles in the inorganic matrix. The quantum dots may be selected from Group XII-XVI quantum dots, Group XIII-XV quantum dots, and Group XIV-XVI quantum dots; and combinations thereof. The Group XII-XVI quantum dots are selected from binary quantum dots including but not limited to CdSe, CdTe, ZnS, ZnSe, ZnTe, ZnO, HgS, HgSe and HgTe; ternary quantum dots including, but not limited to, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS and HgZnSe; and quaternary quantum dots including but not limited to CdZnSeS, CdZnSeTe, CdZnSTe, CdHgSeS, CdHgSeTe, CdHgSTe, HgZnSeS, HgZnSeTe and HgZnSTe.

The Group XIII-XV quantum dots are selected from binary quantum dots including but not limited to GaN, GaP, GaAs, GaSb, AlN, AlP, AlAs, AlSb, InN, InP, InAs and InSb; ternary quantum dots including but not limited to GaNP, GaNAs, GaNSb, GaPAs, GaPSb, AlNP, AlNAs, AlNSb, AlPAs, AlPSb, InNP, InNAs, InNSb, InPAs, InPSb and GaAlNP; and quaternary quantum dots including, but not limited to, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb.

The Group XIV-XVI quantum dot is selected from binary quantum dots including but not limited to SnS, SnSe, SnTe, PbS, PbSe and PbTe; ternary quantum dots including, but not limited to, SnSeS, SnSeTe, SnSTe, PbSeS, PbSeTe, PbSTe, SnPbS, SnPbSe and SnPbTe; and quaternary quantum dots including, but not limited to, SnPbSSe, SnPbSeTe and SnPbSTe.

In the preparation of the quantum dot-inorganic matrix composite, emission wavelength bands of quantum dots can be adjusted to a desired level by controlling the ratio of quantum dot precursors, heating temperature and heating time. For example, when the heating temperature is elevated, relatively small nuclei are rapidly formed, and when the heating temperature is decreased, large nuclei are slowly formed. As a result, emission wavelength bands of quantum dots formed in the inorganic matrix can be controlled.

In accordance with the method of the exemplary embodiments, quantum dots formed in the inorganic matrix may take any shape depending upon reaction conditions. The shape is selected from, but not limited to spheres, tetrahedrons, cylinders, rods, triangles, discs, tripods, tetrapods, cubes, boxes, stars, and tubes. The quantum dots formed in the inorganic matrix are capable of efficiently emitting light in visible spectra and other spectral regions (e.g., ultraviolet and infrared regions).

In accordance with the exemplary embodiments, provided is a quantum dot-inorganic matrix composite prepared by the method of the invention, wherein quantum dots are dispersed in the inorganic matrix.

Figure 2:
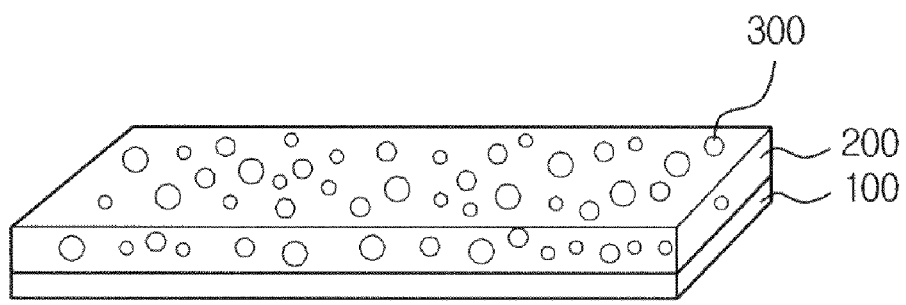

The quantum dot-inorganic matrix composite contains quantum dots whose high quantum efficiency is about 40% or more and which have a high packing density. The quantum dot-inorganic matrix composite according to one exemplary embodiment is shown in FIG. 2. As shown in FIG. 2, a quantum dot-inorganic matrix composite thin film 200 is formed on a substrate 100 and the quantum dot-inorganic matrix composite thin film has a structure in which quantum dots 300 with a high quantum efficiency are densely filled in an inorganic matrix such as but not limited to a glass.

The quantum dots have a high quantum efficiency and are filled at a high packing density in a transparent dielectric such as, but not limited to, glass. The quantum dot-inorganic matrix composite according to the exemplary embodiment can be utilized in a variety of optical device material applications. Examples of devices that can be fabricated from the quantum dot-inorganic matrix composite include, but are not limited to optical amplifiers, lasers, optical displays, planar optical circuits, and organic light emitting diodes ("OLEDs"). The quantum dot-inorganic matrix composite may employ, as a matrix, silica which is directly applicable to silica-based industries, and can be prepared at a relatively low temperature in a simple manner owing in part to the elimination of a separate quantum dot preparation process or a surface-modification process. Accordingly, the quantum dot-inorganic matrix composite is applicable as a material for various displays and electronic devices using a method (e.g., rolling) suitable for mass-production.

In one exemplary embodiment, the quantum dot-inorganic matrix composite may be applied to a white light source. In this case, the quantum dot-inorganic matrix composite may serve as a wavelength converter. In particular, the quantum dot-inorganic matrix composite with an orange wide emission wavelength band applied to a blue LED may be simply used as a white light source.

In another exemplary embodiment, the quantum dot-inorganic matrix composite may be applied to photosensitive devices of erbium amplifiers. The erbium amplifiers may employ various inorganic materials such as, but not limited to, ytterbium in order to overcome the drawbacks caused by the small absorption cross-area of erbium.

Quantum dots have a wide light-absorption wavelength band and a large light-absorption cross-area, thus being suitable for use in photosensitive devices of erbium amplifiers. Quantum dots are therefore easily directly fused with silica-based optical fibers.

The present invention will now be described in further detail with reference to the following examples. These examples are for illustrative purposes only and are not intended to limit the scope of the present invention.

EXAMPLES

Example 1

A CdSe quantum dot-glass composite composed of cadmium and selenium was prepared. A cadmium chloride/ethanol solution was used as a cadmium precursor and a tris(3-hydroxypropyl)phosphine selenide ("THPPSe") complex compound/ethanol solution was used as a selenium precursor. The THPPSe complex compound is prepared by reacting tris(3-hydroxypropyl)phosphine with a selenium pellet (about 2 mm in size). About 200 uL of about 0.25M cadmium chloride ethanol solution, about 100 uL of about 0.5M selenium complex compound ethanol solution and about 700 uL of T-512B SOG (ACCUGLASS T-512B® available from Honeywell Co. Ltd.) were mixed with one another to prepare a total about 1 uL of quantum dot precursor-containing SOG solution. The mixture of the spin-on-glass with the cadmium precursor and selenium precursor thus obtained was spin-coated on a glass substrate with a size of about 2.5 cm×2.5 cm×0.1 cm, to form a SOG film with a thickness of about 900 nm. Subsequently, the SOG film was heated in an oven at about 240° C. for about 4 minutes under a nitrogen atmosphere to yield a quantum dot-inorganic matrix composite thin film.

Example 2

A quantum dot-inorganic matrix composite thin film was obtained in the same manner as Example 1 except that ACCUGLASS P-112LS® available from Honeywell Co. Ltd. was used as the spin on glass.

Figure 3A:
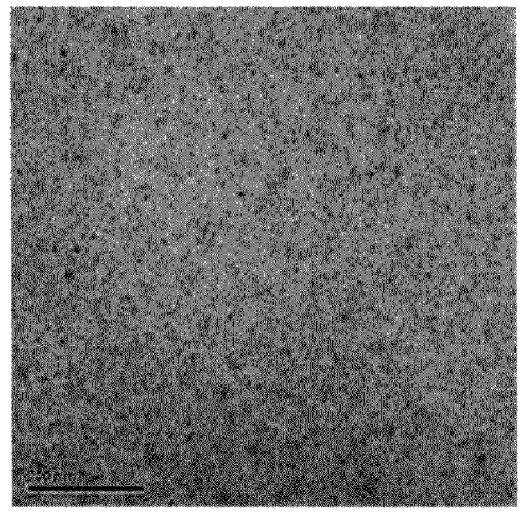
FIGS. 3A and 3B are transmission electron microscopy ("TEM") images of quantum dot-inorganic matrix composites obtained in Examples 1 and 2, respectively.
Figure 3B:
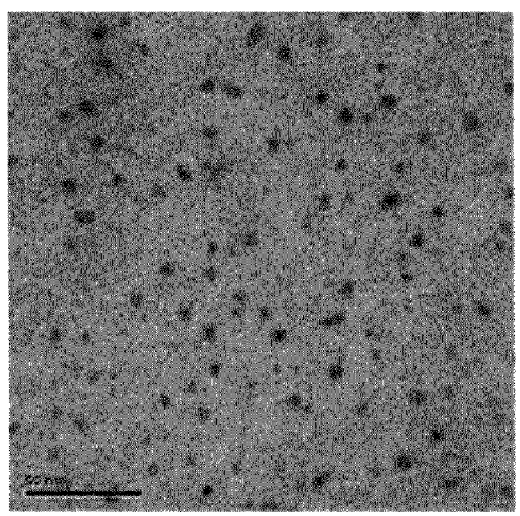

The quantum dot-inorganic matrix composite thin films obtained in Examples 1 and 2 were subjected to transmission electron microscopy ("TEM"). The TEM images thus obtained are shown in FIGS. 3A and 3B. As can be seen from FIGS. 3A and 3B, quantum dots are homogeneously dispersed in the quantum dot-inorganic matrix composite.

Examples 3-5

A quantum dot-inorganic matrix composite thin film was obtained in the same manner as Example 1 except that cadmium and selenium precursors were used at different concentrations, as set forth in Table 1 below.

TABLE 1

| Sample | Cadmium concentration (mmol/mL) | Selenium concentration (mmol/mL) |
|---|---|---|
| Ex 1 | 50 | 50 |
| Ex 3 | 75 | 50 |
| Ex 4 | 50 | 75 |
| Ex 5 | 25 | 25 |

Figure 4:
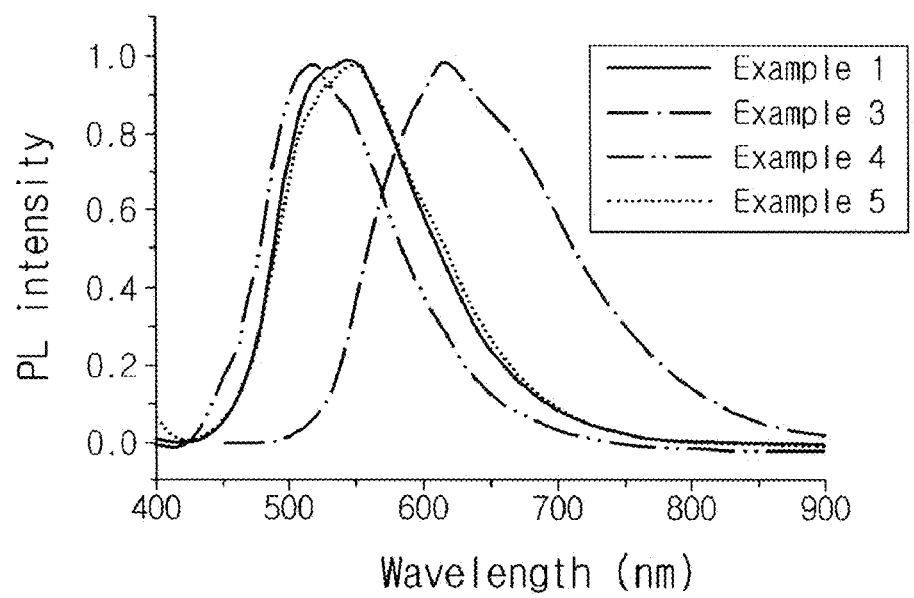
Figure 5:
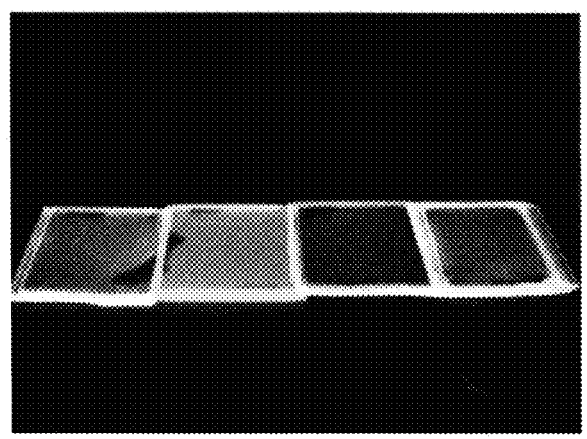

Fluorescence spectra of the quantum dot-glass composites prepared in Examples 1, and 3 to 5 are shown in FIG. 4. As can be seen from FIG. 4, when the cadmium and selenium precursors are used at different concentrations, composites containing quantum dots that fluoresce at different wavelengths can be prepared. Fluorescence images of the quantum dot-glass composites prepared in Examples 1, and 3 to 5 directly taken under a UV lamp are shown in FIG. 5. In FIG. 5, the fluorescence images correspond to those of Examples 1, 3, 4 and 5 in this order from left to right.

Examples 6-10

Figure 6:

A quantum dot precursor-containing SOG solution with the same composition as in Example 1 was spin-coated on a glass substrate and then heated at temperatures of about 150° C. (Example 6), about 180° C. (Example 7), about 210° C. (Example 8), about 270° C. (Example 9), about 240° C. (Example 10) for about 2 hours to prepare quantum dot-inorganic matrix composite thin films. Fluorescence images of quantum dot-glass composite thin film prepared in Example 6 to 10 are shown in FIG. 6. Fluorescence excitation was induced using a UV lamp. FIG. 6 shows the fluorescence images of quantum dot composite thin films of Examples 6, 7, 8, 9 and 10 prepared at about 150° C., about 180° C., about 210° C., about 270° C. and about 240° C., respectively, in this order from top left clockwise. FIG. 6 exemplifies, while using the same SOG solution, that varying the heating temperature can control emission wavelengths of a quantum dot-inorganic matrix composite.

Exemplary embodiments have been described in detail with reference to the foregoing preferred embodiments. However, exemplary embodiments are not limited to the preferred embodiments. Those skilled in the art will appreciate that various modifications and variations are possible, without departing from the scope and spirit of the appended claims.

What is claimed is:

1. A method for preparing a quantum dot-inorganic matrix composite, the method comprising:
    preparing an inorganic matrix precursor solution containing one or more quantum dot precursors, wherein the preparing of the inorganic matrix precursor solution comprises mixing a quantum dot precursor solution, in which the one or more quantum dot precursors are dissolved in a solvent which can be coordinated thereto, with an inorganic matrix precursor;
    spin-coating the inorganic matrix precursor solution on a substrate to form an inorganic matrix thin film; and
    heating the inorganic matrix thin film to form an inorganic matrix and grow the quantum dot precursors to form quantum dots in the inorganic matrix, thereby yielding a quantum dot-inorganic matrix composite.

2. The method according to claim 1, wherein the inorganic matrix precursor solution contains two or more quantum dot precursors.

3. The method according to claim 1, wherein the quantum dot precursor comprises an element selected from the group consisting of a Group XII element, a Group XIII element, a Group XIV element, a Group XV element, and a Group XVI element; and combinations thereof.

4. The method according to claim 1, wherein the inorganic matrix precursor solution comprises an inorganic matrix precursor selected from the group consisting of a silicate, a siloxane, a silsesquioxane, a perhydrosilazane and a silazane; and the inorganic matrix precursor is dissolved in an organic solvent.

5. The method according to claim 1, wherein the step of heating is carried out at a temperature of about 150° C. to about 300° C.

6. The method according to claim 1, wherein the inorganic matrix is a metal oxide selected from the group consisting of $SiO_2$, $TiO_2$, $ZrO_2$, ZnO, ITO and SnO.

7. The method according to claim 1, wherein the quantum dots formed in the inorganic matrix during the heating are selected from the group consisting of Group XII-XVI quantum dots, Group XIII-XV quantum dots and Group XIV-XVI quantum dots; and combinations thereof.

* * * * *